(12) United States Patent
Jaeger et al.

(10) Patent No.: US 6,700,567 B1
(45) Date of Patent: Mar. 2, 2004

(54) SELF-POWERED INPUT DEVICES FOR CIRCUIT CONTROL DEVICES

(75) Inventors: Denny Jaeger, Oakland, CA (US); Kenneth M. Twain, Oakland, CA (US)

(73) Assignee: Intertact Corporation, Oakland, CA (US)

( * ) Notice: Subject to any disclaimer, the term of this patent is extended or adjusted under 35 U.S.C. 154(b) by 585 days.

(21) Appl. No.: 09/639,298

(22) Filed: Aug. 15, 2000

Related U.S. Application Data

(63) Continuation-in-part of application No. 09/139,078, filed on Aug. 24, 1998, now Pat. No. 6,326,956.
(51) Int. Cl.$^7$ .................................................. G09G 5/00
(52) U.S. Cl. ..................................... 345/179; 178/19.01
(58) Field of Search ................................. 345/179, 180, 345/182, 183; 178/19.01, 19.05, 20.01

(56) References Cited

U.S. PATENT DOCUMENTS 5,294,792 A * 3/1994 Lewis et al. ................ 250/221
5,528,002 A * 6/1996 Katabami ................ 179/19.06
6,130,666 A * 10/2000 Persidsky .................... 345/179

* cited by examiner

Primary Examiner—Kent Chang
(74) Attorney, Agent, or Firm—Harris Zimmerman

(57) ABSTRACT

A powered touch screen input device is perpetually self-powered and free of any mechanical connection to the touch screen itself. The input device includes at least one photovoltaic cell supported thereon and disposed to receive light from the display screen associated with the touch screen device. The photovoltaic cell is connected to the electronic signaling circuit disposed within the input device. The input device comprises a stylus having a proximal tip connected to the electronic signaling circuit to generate or receive actinic radiation and interact with the touch screen device. A bezel extends about the barrel to enclose the photovoltaic cells and direct light from the display screen to the cells. Alternatively, RF energy may be transmitted to an antenna in the input device and rectified to drive the electronic signaling circuit.

12 Claims, 3 Drawing Sheets

US 6,700,567 B1

SELF-POWERED INPUT DEVICES FOR CIRCUIT CONTROL DEVICES

REFERENCE TO RELATED APPLICATION

This application is a continuation-in-part of U.S. utility application Ser. No. 09/139,078, filed Aug. 24, 1998 now U.S. Pat. No. 6,326,956, for which priority is claimed.

BACKGROUND OF THE INVENTION

This invention relates to controls for electrical apparatus and, more particularly, to circuit control devices for use with electronic image display screens having the capability of receiving operator input as well as displaying images, data, and other meaningful visual outputs.

The concept of combining electronic image display screens with operator input sensor apparatus correlated to the images presented on the display screen is well known in the prior art, as exemplified by the U.S. patents issued to the present inventor:
U.S. Pat. No. 5,572,239
U.S. Pat. No. 5,977,955
U.S. Pat. No. 5,805,146
U.S. Pat. No. 5,805,145
U.S. Pat. No. 5,936,613
U.S. Pat. No. 5,774,115

The technology for operator input sensor apparatus, commonly known under the overarching term "touch screen", actually comprises any one of several schemes for detecting and transmitting operator inputs related to the images presented on the associated display screen. These devices may employ detection based on optical, capacitance, magnetic, or resistance effects. Many of these devices employ a stylus or pen to impart the operator's control input to the touch screen device. Typically, the stylus incorporates an electronic signaling circuit that either receives or emits a signal that is used by the touch screen device to determine the position of the stylus on the touch screen, and thus correlate the input position with the corresponding image portion of the display screen. The electronic circuit in the stylus receives power from either an internal battery or an external power supply connected by cable to the stylus.

Both of these conventional power arrangements suffer from primary drawbacks. The internal battery must be replaced periodically, and the diminishing voltage of a failing battery may affect the functioning of the sensor system. A connector cable joined to the stylus is an encumbrance to free use of the stylus, and is a snag hazard on a desk or work table. Thus the prior art is deficient in providing a powered sensor stylus that is free of these drawbacks.

The closest known prior art in this regard is described in U.S. Pat. No. 5,936,613, issued Aug. 10, 1999 to the present inventors. This invention discloses a knob-like controller supported by a base member secured to a display screen, and a photovoltaic cell disposed in the base member to receive light from the screen and generate electrical energy that powers the signal circuit of the knob-like controller. This device can only be implemented by use of a device placed in front of a display, either on a superstrate in front of a display or on the display itself, which may be a detriment in some graphic display situations: i.e., rapidly changing image content, or the like. Thus the prior art does not include a powered touch screen input stylus that is perpetually self-powered and free of any attachment to the touch screen itself. Likewise, U.S. Pat. No. 5,774,115, issued Jun. 30, 1998 to the present inventors, discloses powered touch screen input devices that receive transmitted power without resorting to batteries or electrical power connections to the touch screen system, but these devices are also mechanically secured to the touch screen itself.

SUMMARY OF THE INVENTION

The present invention generally comprises a powered touch screen input device that is perpetually self-powered and free of any mechanical connection to the touch screen itself. In one aspect, the input device includes at least one photovoltaic cell supported thereon and disposed to receive light from the display screen associated with the touch screen device. The photovoltaic cell is connected to the electronic signaling circuit disposed within the input device. This signaling circuit may comprise a radio frequency transmitter, or a light emitting diode or laser, or a magnetic field generator, or any other circuit that is adapted to interact with any touch screen device known in the prior art. The input device is adapted to be wielded by the user of the touch screen and to be placed in contact or close spacing to the touch screen device. Position and movement of the input sensor are correlated by a software driven processor with the images generated on the display screen associated with the touch screen system. At the same time, the photovoltaic cell(s) of the input device are connected to power the onboard signaling circuit of the input device, so that all necessary power for the input device is delivered whenever the device is situated proximate to the display screen, without resort to batteries, cables, or tethers of any kind.

In another aspect, the invention comprises a stylus for use with a touch screen device associated with a display screen. The stylus includes an electronic signaling circuit designed to interact with the touch screen device, whereby the position and movement of the stylus on the touch screen may be correlated with the image content generated by the display screen. The stylus includes a proximal tip connected to the electronic signaling circuit to generate or receive radiation from the touch screen and interact therewith. The stylus further includes at least one photovoltaic cell disposed adjacent to said proximal tip and disposed to receive light emanating from the display screen. The photovoltaic cell(s) is connected to power the electronic signaling circuit, so that no batteries or mechanical connections to any extrinsic power supply are required.

The stylus system may be scaled so that the photovoltaic cell(s) provide sufficient power to the electronic signaling circuit whenever the stylus tip is brought into proximate contact with the touch screen device. Thus the stylus is self-powered whenever it is brought into use, but is otherwise not mechanically or electrically connected to the touch screen device.

In a further embodiment, the invention provides a powered touch screen input device that is powered by electrical energy transmitted to the input device from the touch screen system. The touch screen system includes an antenna that radiates RF energy in the area immediately about the touch screen itself. The input device includes a coil that acts as an receiving antenna to receive the RF energy, which is rectified and smoothed and connected to power the electronic signaling circuit. The broadcast antenna may comprise a coil or coils arrayed about the periphery of the touch screen system, or disposed at the back surface of the touch screen itself. The receiving coil is tuned to optimize reception of the RF energy, and may be placed in the bezel or barrel of the stylus described above. The RF power transmission to the input device results in an input device that is perpetually self-powered when it is brought into proximity to the touch screen system, and which needs no mechanical or electrical connection to the touch screen system.

The RF transmission system may also be combined with the photovoltaic cells described above, whereby the input device is assured of sufficient power for operation.

DESCRIPTION OF THE PREFERRED EMBODIMENTS

Figure 1:
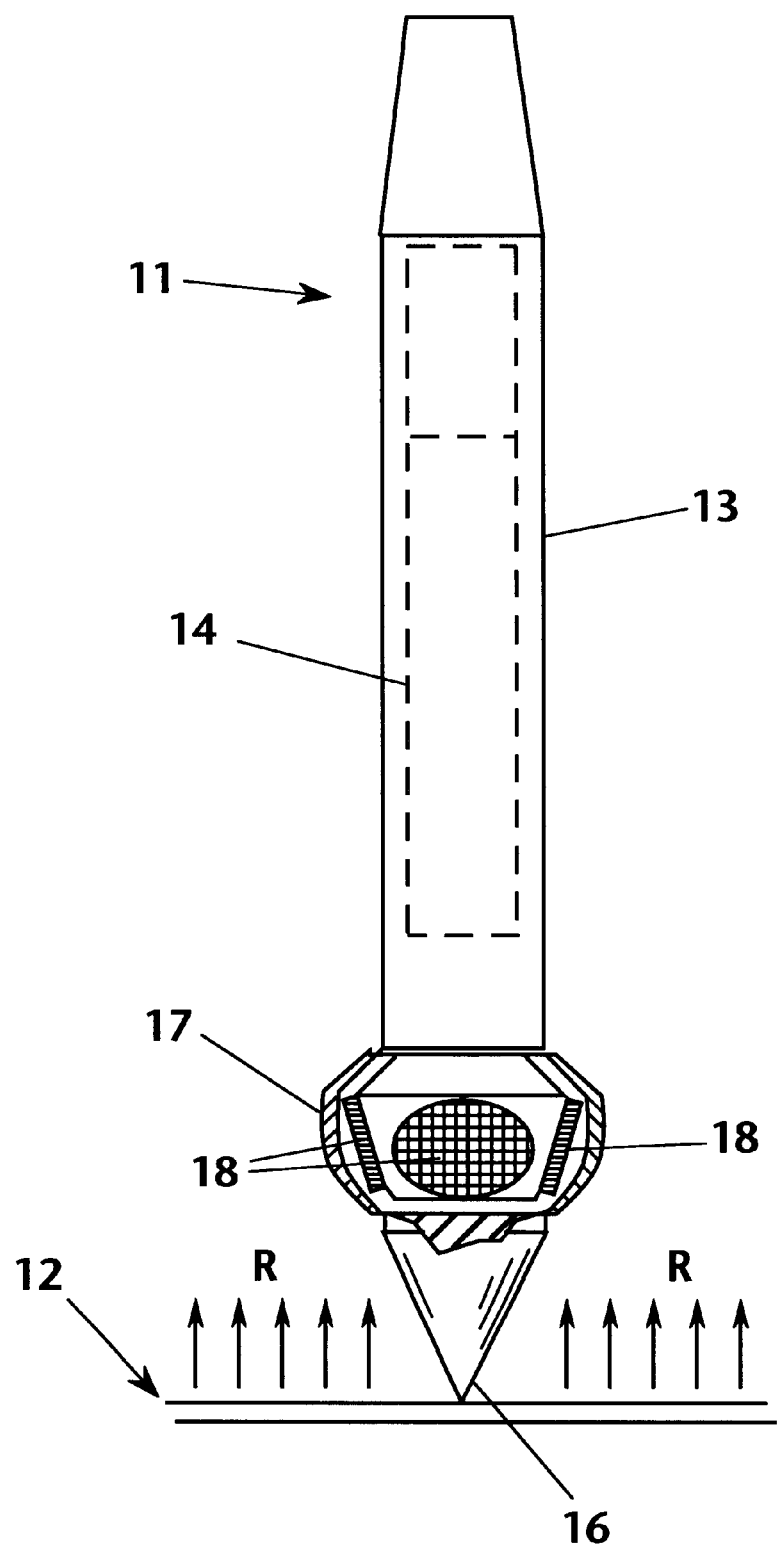
FIG. 1 is a partially sectioned plan elevation of the powered touch screen input device of the invention that is perpetually self-powered.

The present invention generally comprises a powered touch screen input device that is perpetually self-powered and free of any mechanical connection to the touch screen itself. With regard to FIG. 1, the invention includes a stylus or pen 11 that is adapted to interact with a touch screen device 12 that is combined with a display screen of a computer or similar apparatus. The touch screen device 12 may be of any conventional design, and permits light R from the images generated by the display screen to radiate therethrough, so that the images are viewable without interference. The stylus enables the user to input information to the computer by interacting with the image content of the display screen, the stylus position relative to the image content being correlated with the desired command or data input.

The stylus 11 includes a barrel 13 adapted to be manually grasped and wielded by the user, much like a convention pen or pencil. Within the barrel 13, an electronic signaling circuit 14 is disposed. In general, the signaling circuit 14 may emit or receive signals from the touch screen device 12. The circuit 14 is connected to the proximal tip 16 of the stylus 11, which is designed to impinge on the touch screen device 12 and to receive or impart a position-determining signal thereto. The signal emitted from tip 16 may be a radio frequency signal, an LED or laser diode output, a magnetic or electric field, or any other signaling arrangement used by touch screen devices known in the prior art for resolving the position of the proximal tip 16 on the touch screen device 12.

The stylus further includes a bezel 17 extending about the proximal end of the barrel and adjacent to the tip 16. The bezel is formed of a material that transmits the light R emanating from the display screen. Within the bezel, at least one photovoltaic cell 18 is disposed and oriented so that when the tip 16 is pointed toward the display screen and in close proximity thereto, the cell(s) 18 are receiving light from the display screen and generating power. The output of the cell(s) 18 is combined and connected to power the electronic signaling circuit 14. The photovoltaic cell(s) is scaled so that the average light received by the cells 18 from the display screen when the tip 16 is touching or closely proximate the touch screen device 12 is sufficient to generate enough voltage and current to power the electronic signaling circuit 14. Thus the stylus 11 is self-powered whenever it is brought into use, and it is never in need of external power sources or replacement battery sources. Nonetheless, the device 11 may include a system for storing electrical energy created by the photovoltaic cells 18, so that the photovoltaic power that is generated may be accumulated to meet the power requirements of the circuit 14. A storage system may include a rechargeable battery, storage capacitor, or any other equivalent technique known in the prior art.

It the embodiment of FIG. 1, the photovoltaic cells 18 are arrayed at equal angles about the axis of the barrel 13, and may comprise three or four cells. The curvature of the bezel 17 serves as an annular light gathering lens that captures more of the light R radiating from the display screen and increases the output of the cells 18.

The device 11 may be used with any appropriate touch screen device. There is no mechanical connection or electrical connection between the device 11 and the touch screen device 12, so that a stylus may be used on a plurality of similar touch sensor systems. The freedom from cables or tethers connected to the stylus, in combination with the elimination of battery changing, are compounded advantages that are unknown in the prior art.

Figure 2:
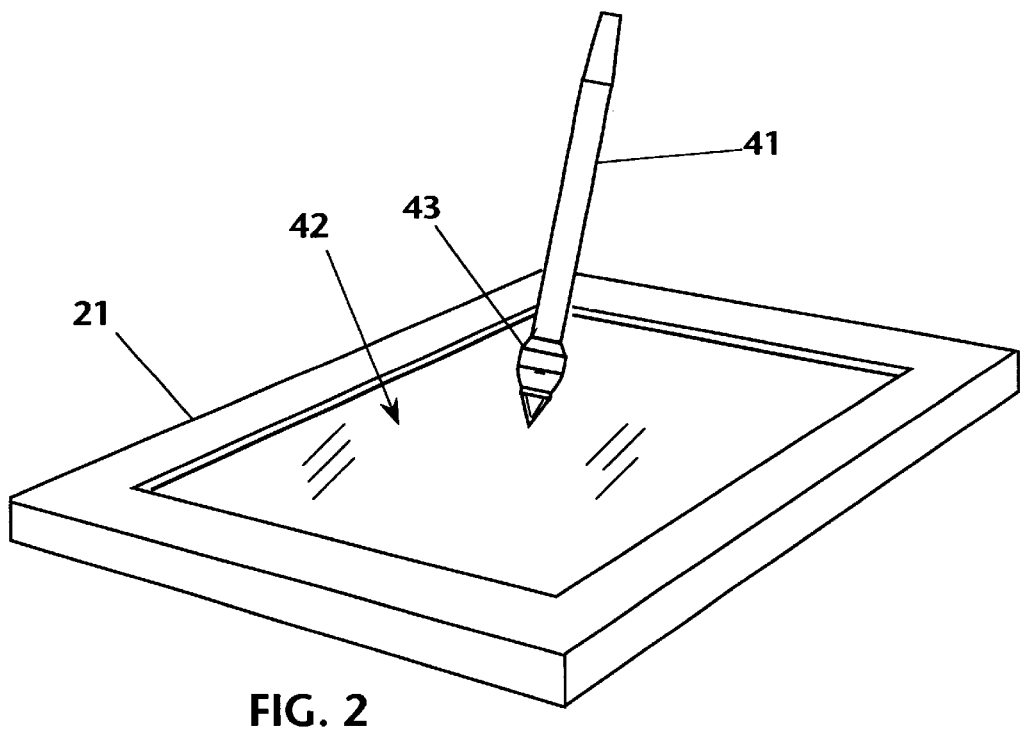
FIG. 2 is a perspective view of the powered touch screen input device in combination with a representative touch screen device.
Figure 3:
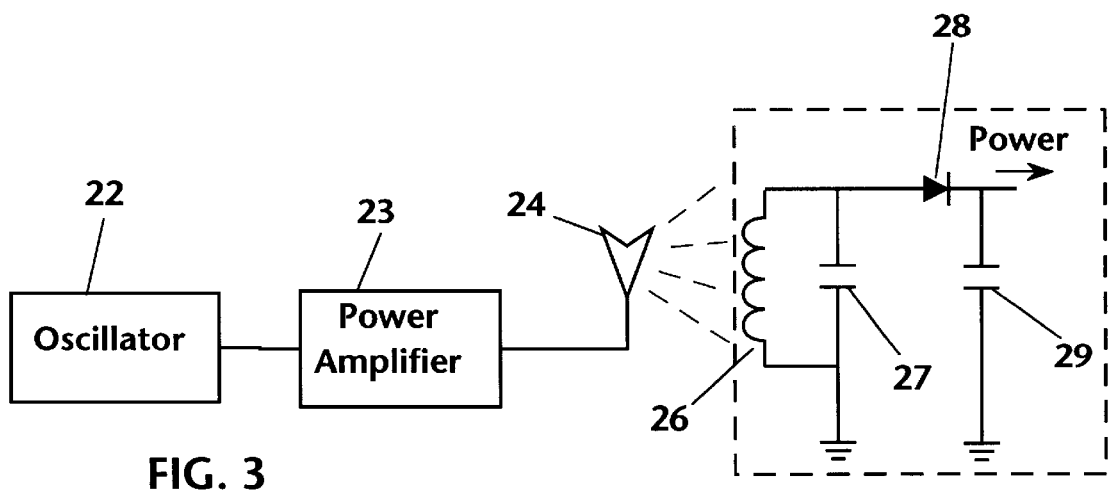
FIG. 3 is a partially schematic block diagram of a further embodiment, depicting the transmission of RF energy to the input device.
Figure 4:
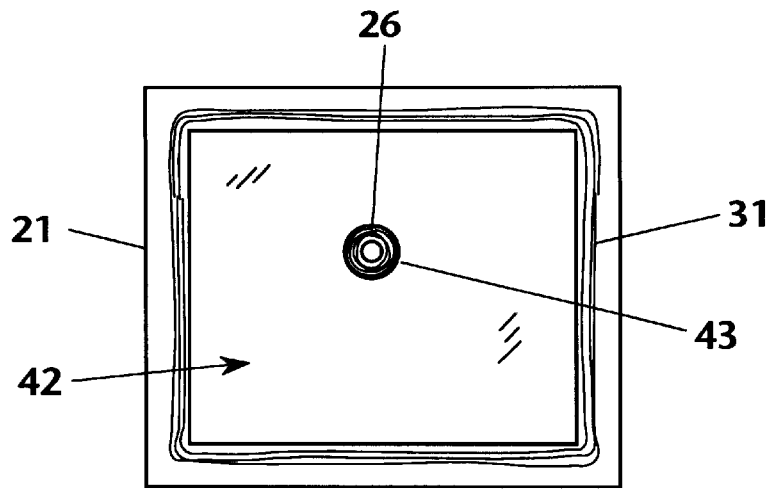
FIG. 4 is a plan view depicting one placement of the RF transmitting antenna coil and the RF receiving coil in the powered input device.

With regard to FIGS. 2–4, a further embodiment of the invention is depicted. An input device 41 is associated with a touch screen system 42 that is combined with a display screen that presents image content under the control of a computer or microprocessor or the like. The input device is depicted as a pen or stylus, similar to the previous embodiment, but it is understood that the device 41 represents any touch screen input device known in the prior art, including those that are secured to the touch screen on a temporary or permanent basis. The touch screen system 42 includes a peripheral frame or bezel 21.

With regard to FIG. 3, the touch screen system 42 includes an oscillator 22 that generates an RF signal at a predetermined frequency, and this output is fed to a power amplifier 23 and thence to an antenna 24. The antenna is configured to radiate RF energy in the area immediately about the touch screen Within the input device 41 there is a receiving antenna, such as coil 26, that is disposed to receive the RF signal radiated by antenna 24. The coil 26 is connected in parallel with capacitor 27 to tune the receiver circuit to the frequency transmitted by antenna 24, and the output of the LC circuit is fed through diode 28 to rectify the output. Capacitor 29 smooths the rectified output, which is then conducted to the electronic signaling circuit of the input device, as described previously. Thus power is supplied to the input device 41 without resorting to connecting wires, or internal batteries, although onboard power storage may be provided to accumulate the electrical energy received and meet the power requirements of the electronic signaling circuit.

With regard to FIG. 4, the transmitting antenna may comprise a coil 31 disposed in the bezel 21 and circumscribing the periphery of the touch screen. The coil 31 is thus disposed directly adjacent to the front surface of the touch screen, and well positioned to direct RF energy to the input device 41. The device 41 includes a bezel 43, and the receiving antenna coil 26 is disposed within the bezel 21. In this arrangement the axes of the transmitting and receiving coils are generally aligned to optimize transmission of the RF energy therebetween. However, the transmitting antenna may be disposed in other positions behind or adjacent to the touch screen, and may comprise more than one antenna or coil. As in the previous embodiment, the input device 41 receives operating power whenever it is in proximity to the touch screen system 42, and the device 41 is free of any electrical connection to the touch screen system 42. The input device 41 may also be free of any mechanical connection to the system 42, or may be joined to the system on a temporary or permanent basis.

Figure 5:
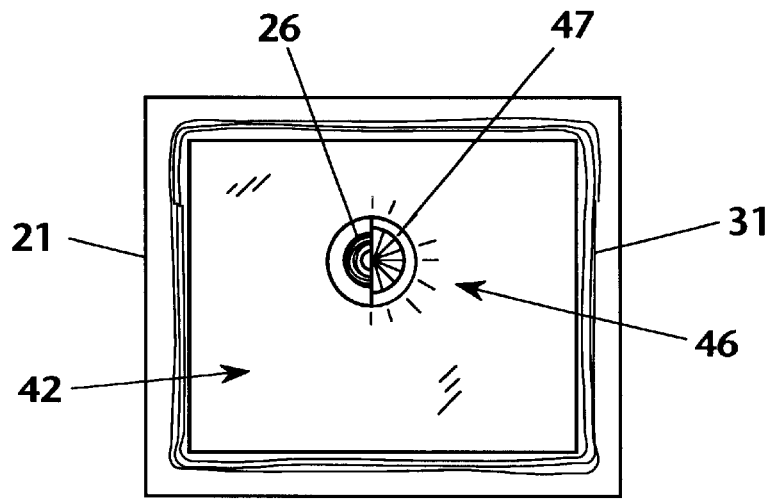
FIG. 5 is a plan view depicting the placement of the RF transmitting antenna coil and the RF receiving coil in a powered input device supported on the touch screen device.

With regard to FIG. 5, a further embodiment of the invention provides a touch screen system 42 as before, with a bezel or outer frame 21 and a transmitting coil 31 disposed in the bezel 21 about the touch screen or cover plate thereof. A powered touch screen input device 46 comprises a knob controller 47 that is secured on a temporary or permanent basis to the touch screen or cover panel thereof. Such devices are known in the prior art and described in U.S. Pat. No. 5,774,115, issued to the present inventors. A receiving antenna 26 is disposed within the knob controller 47 and disposed to receive RF energy from the transmitting antenna 31. As in the previous embodiment, the input device 46 receives operating power whenever it is in proximity to the touch screen system 42, and the device 46 is free of any electrical connection to the touch screen system 42.

Figure 6:
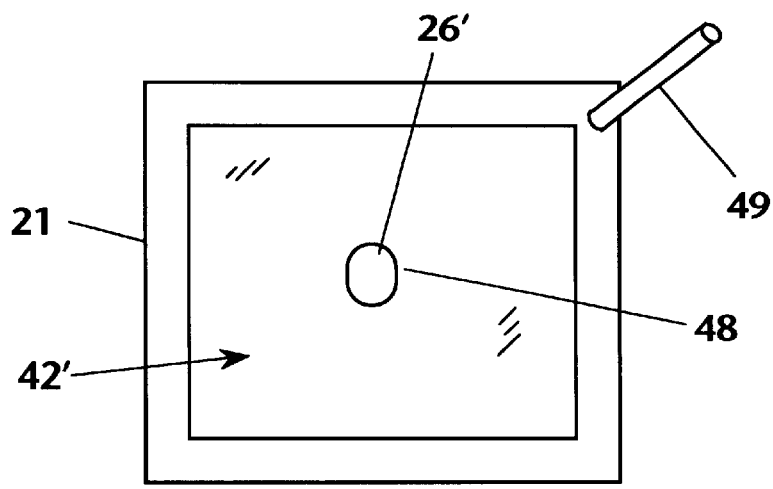
FIG. 6 is a plan view similar to FIG. 5 illustrating another embodiment of the invention.

With regard to FIG. 6, another embodiment of the invention provides a touch screen system 42' substantially as described previously, with a bezel or outer frame 21. A powered touch screen input device 48 may comprise a device supported on the touch screen or cover panel, as in FIG. 5, or a stylus free of the touch screen system, as in FIG. 4. The device 48 includes a receiving antenna that may comprise a coil or any other effective antenna configuration known in the prior art. A transmitting antenna 49 is disposed adjacent to the touch screen itself, and may be secured to the bezel 21 or to any other proximate structure within range to effectively transmit RF power to the antenna in the input device 48. As in the previous embodiment, the input device 48 receives operating power whenever it is in proximity to the touch screen system 42', and the device 48 is free of any electrical connection to the touch screen system 42'.

The foregoing description of the preferred embodiment of the invention has been presented for purposes of illustration and description. It is not intended to be exhaustive or to limit the invention to the precise form disclosed, and many modifications and variations are possible in light of the above teaching without deviating from the spirit and the scope of the invention. The embodiment described is selected to best explain the principles of the invention and its practical application to thereby enable others skilled in the art to best utilize the invention in various embodiments and with various modifications as suited to the particular purpose contemplated. It is intended that the scope of the invention be defined by the claims appended hereto.

What is claimed is:

1. In a powered input device for a touch screen system and display screen that includes an electronic signaling circuit in the input device, the improvement comprising:
    means for transmitting RF energy to the vicinity of said touch screen system;
    means in said input device for receiving said RF energy and converting the received RF energy to a power signal;
    means for connecting said power signal to said electronic signaling circuit;
    said input device being free of any mechanical connection to said touch screen system.

2. The improved powered input device of claim 1, wherein said means for transmitting RF energy includes an antenna disposed proximate to said touch screen system.

3. The improved powered input device of claim 2, wherein said antenna comprises a coil that circumscribes the periphery of said touch screen system.

4. The improved powered input device of claim 2, wherein said means for receiving said RF energy includes a receiver antenna coil disposed in said input device.

5. The improved powered input device of claim 4, further including capacitor means connected to said receiver antenna coil to tune said receiver antenna coil to the frequency of said transmitted RF energy.

6. The improved powered input device of claim 5, further including rectifier means connected to said receiver antenna coil to rectify and smooth the output of said antenna receiver coil and generate said power signal.

7. In a powered input device for a touch screen system and display screen that includes an electronic signaling circuit in the input device, the improvement comprising:
    means for transmitting RF energy to the vicinity of said touch screen system;
    means in said input device for receiving said RF energy and converting the received RF energy to a power signal;
    means for connecting said power signal to drive said electronic signaling circuit;
    said input device being free of any electrical connection to said touch screen system,
    said means for transmitting including an antenna disposed at the periphery of said touch screen system.

8. The improved powered input device of claim 7, wherein said antenna includes an antenna coil.

9. The improved powered input device of claim 8, wherein said antenna coil circumscribes the periphery of said touch screen system.

10. The improved powered input device of claim 7, wherein said antenna extends from said periphery of said touch screen system.

11. In a powered input device for a touch screen system and display screen that includes an electronic signaling circuit in the input device, the improvement comprising:
    means for transmitting RF energy to the vicinity of said touch screen system;
    means in said input device for receiving said RF energy and converting the received RF energy to a power signal;
    means for connecting said power signal to drive said electronic signaling circuit;
    said input device being free of any electrical connection to said touch screen system,
    said means for transmitting including an antenna disposed at a location external to said touch screen system.

12. In a powered input device for a touch screen system and display screen that includes an electronic signaling circuit in the input device, the improvement comprising:
    means for transmitting RF energy to the vicinity of said touch screen system;
    means in a said input device for receiving said RF energy and converting the received RF energy to a first power signal;
    means for connecting said power signal to said electronic signaling circuit;
    at least one photovoltaic cell supported by said powered input device, said at least one photovoltaic cell generating a second power signal to power said electronic signaling circuit;
    said first and second power signals connected to power said electronic signaling circuit.

* * * * *